(12) United States Patent
Miyakawa

(10) Patent No.: US 6,235,619 B1
(45) Date of Patent: May 22, 2001

(54) MANUFACTURING METHOD FOR REDUCED SEMICONDUCTOR MEMORY DEVICE CONTACT HOLES WITH MINIMAL DAMAGE TO DEVICE SEPARATION CHARACTERISTICS

(75) Inventor: Yasuhiro Miyakawa, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/336,749

(22) Filed: Jun. 21, 1999

(30) Foreign Application Priority Data

Jul. 10, 1998 (JP) .................................................. 10-196242
Mar. 11, 1999 (JP) .................................................. 11-065159

(51) Int. Cl.[7] .................... H01L 21/3205; H01L 21/4763
(52) U.S. Cl. .......................... 438/585; 438/587; 438/592; 438/624; 438/627; 438/629
(58) Field of Search .................................. 438/585, 587, 438/592, 624, 627, 629, 639

(56) References Cited

U.S. PATENT DOCUMENTS 5,175,120 * 12/1992 Lee .......................................... 437/48
5,668,052 * 9/1997 Matsumoto et al. .................. 438/264
5,792,705 * 8/1998 Wang et al. ........................... 438/264

* cited by examiner

*Primary Examiner*—Olik Chaudhuri
*Assistant Examiner*—Shrinivas H. Rao
(74) *Attorney, Agent, or Firm*—Jones Volentine, LLC

(57) ABSTRACT

A semiconductor device manufacturing method capable of coping with scale reduction of the semiconductor device and forming contact holes without deteriorating the device separation characteristics is provided. This method has the following steps. First, in the laminating process, at least a first layer, a second layer, and a third layer are formed in sequence. The second layer and the third layer are laminated over the first layer in sequence so as to cover a plurality of gate electrodes formed on the first layer. Second, in the first etching process, an opening unit is formed between the gate electrodes, and the third layer is etched using the second layer as an etching stopper. Third, in the depositing process, an insulating material film is deposited on the side wall of the opening unit and the bottom portion of the opening unit to a thickness with which the insulating material film functions as a spacer for the insulation. Fourth, in the second etching process, a contact hole is formed by anisotropically etching the insulating material film deposited at the bottom portion of the opening unit and the second layer beneath the insulating material film to expose the first layer.

16 Claims, 15 Drawing Sheets

MANUFACTURING METHOD FOR REDUCED SEMICONDUCTOR MEMORY DEVICE CONTACT HOLES WITH MINIMAL DAMAGE TO DEVICE SEPARATION CHARACTERISTICS

BACKGROUND OF THE INVENTION

1. Field of the Invention

The present invention relates to a semiconductor device manufacturing method, and more particularly to a semiconductor device manufacturing method that includes a contact hole forming process.

2. Description of Related Art

In a semiconductor device that is manufactured by forming multiple films on a substrate, contact holes are usually formed to connect a wire in an upper layer with a wire or an electrode in a lower layer. These contact holes are usually constructed by forming a resist pattern on the upper layer using a lithography process and then performing an etching process until the lower layer is exposed.

However, the conventional semiconductor device manufacturing method has problems. For example, the resist pattern is occasionally displaced when it is formed, and a portion of the silicon oxide film of the device separation unit is occasionally removed when a silicon nitride film that is used as an etching stopper is over-etched. Given these problems, in order to prevent the device characteristics and the manufacturing yield from deteriorating, the structure of the semiconductor device is determined taking the margin of alignment into consideration.

As the semiconductor device is scaled down, the dimensions of the structure of the semiconductor device such as the width of the activation region between device separation regions, the width of the transfer gate, the size of the contact hole, and the like are being scaled down also. However, the margin of alignment is not being scaled down accordingly. Therefore, the margin of alignment is one of the major factors preventing a further scale reduction of the semiconductor device.

SUMMARY OF THE INVENTION

Given these problems, it is an object of the present invention to provide a semiconductor device manufacturing method capable of solving these problems.

To solve the above-stated problems, a semiconductor device manufacturing method according to the present invention has the following steps. First, in the depositing process, at least a first layer, a second layer, and a third layer are formed in sequence. The second layer and the third layer are laminated in sequence over the first layer so as to cover plural gate electrodes formed on the first layer. Second, in the first etching process, an opening unit is formed between the gate electrodes, and the third layer is etched using the second layer as an etching stopper. Third, in the depositing process, an insulating material film is deposited on the side wall of the opening unit and the bottom portion of the opening unit to a thickness with which the insulating material film functions as a spacer for the insulation. Fourth, in the second etching process, a contact hole is formed by anisotropically etching the insulating material film deposited at the bottom portion of the opening unit and the second layer beneath the insulating material film to expose the first layer.

DETAILED DESCRIPTION OF THE INVENTION

Figure 1:
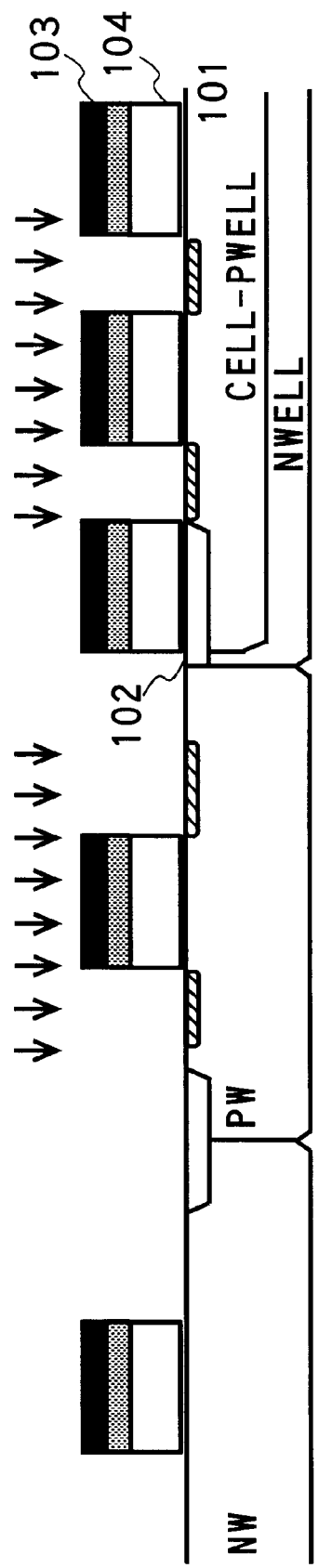
FIG. 1 shows formation of transfer gates and injection of impurities in the first process of a semiconductor device manufacturing method according to the first embodiment of the present invention.

In what follows, the present invention will be explained in detail.

In general, in manufacturing a semiconductor device having at least two layers (the second layer and the third layer) over the first layer, when opening a contact hole on the first layer, the third layer is etched using the second layer as the etching stopper. Next, the contact hole is opened on the first layer by performing an anisotropy etching process on the second layer. This process will be explained using a specific example. In a semiconductor device in which a silicon nitride film and a silicon oxide film are formed on a silicon substrate, in order to open a contact hole on the silicon substrate, the silicon oxide film is etched using the silicon nitride film as an etching stopper. Next, the contact hole is opened on the silicon substrate by anisotropically etching the silicon nitride film.

In this method, no layer serves as a stopper or spacer when the silicon nitride layer as the second layer is etched. Therefore, over-etching cannot be prevented. If the second layer has been over-etched, when a conductive material is embedded in the contact hole, the insulation performance of the contact hole with respect to a structure such as a transfer gate adjacent to the contact hole can deteriorate.

According to the present invention, the third layer is etched using the second layer as a stopper first. An insulating material film having an appropriate thickness is then formed inside the opening formed already, and then the second layer is etched. Therefore, over-etching to a transfer gate is prevented by the insulating material film.

In addition, according to the present invention, by forming the insulating material film having an appropriate thickness inside the opening, the size of the contact hole on the first layer is decreased. As a result, the allowable alignment margin of the opening is increased.

Here, the appropriate thickness refers to the film thickness with which the film functions as the spacer for the insulation without completely sealing the opening. In the case in which the contact hole is opened between the transfer gates, the film thickness should be determined so that the film will not completely seal the portion between the transfer gates, the portion between the conductive material to be embedded inside the contact hole (this conductive material is used to form bit lines, capacitor electrodes, and the like) and the transfer gates will be completely insulated, and the diameter of the opening in a direction parallel to the transfer gates after the insulating material film has been formed will be shorter than the length of the activation region in which the contact hole is formed in the direction parallel to the transfer gates.

According to the present invention, the contact hole can be formed with a stable margin of alignment. Therefore, the present invention can cope with any scale reduction of the semiconductor device, and a contact hole can be formed suppressing the deterioration of the device separation characteristic.

In the present specification, the term "not sealed" means that the opening and the grooves between the transfer gates are not completely sealed. In other words, this means that, after the insulating material film is formed on the side wall and the bottom of the opening and on the side wall and the bottom of the groove between the transfer gates, the original shapes of the opening and the groove still retain recognizable.

In the manufacturing method of the present invention, a two-layer etching stopper film may be used in the etching process. More specifically, the laminating process may be a process in which at least the second, third, and fourth layers are laminated over the first layer, and the first etching process is a process in which the opening unit is formed, the fourth layer is etched using the third layer as an etching stopper, and the third layer is anisotropically etched using the second layer as an etching stopper.

There is no restriction on the choice of materials to be used for the second, third, and fourth layers, respectively, provided that the materials can be used to manufacture the semiconductor and different materials are used for adjacent layers. For example, a silicon oxide film, a silicon nitride layer, and a silicon oxide layer are used for the second, third, and fourth layers, respectively.

The first layer is usually a silicon substrate having a plurality of transfer gates. The plurality of transfer gates is usually arranged approximately parallel crossing over the activation region partitioned by the device separation region. The device separation region is formed on the silicon substrate by the shallow trench method or the LOCOS method. Once the transfer gates are formed on the silicon substrate, a side wall is formed on each of the transfer gates, and ions are injected by the ion plantation method into the silicon substrate. The side wall is formed by depositing a silicon oxide film and a polycrystalline silicon film or a silicon nitride film sequentially on the silicon substrate on which the transfer gates are formed, and then anisotropically etching the polycrystalline silicon film or silicon nitride film. The duration of the anisotropy etching process is determined so that the sum of the thickness of the silicon oxide film and the width of the side wall will be large enough to serve as a mask to be used for forming the diffused layer, forming the source/drain regions of the MOSFETs. After the ions are injected, the polycrystalline silicon film or silicon nitride film is removed using the silicon oxide film as the stopper. In this way, the silicon oxide film can be used as the second layer.

The contact hole is opened not only between the transfer gates but also on the transfer gates. The manufacturing method of the present invention is suitably applicable for this purpose as well. More specifically, in the above-described manufacturing method, the offset insulating film formed on the transfer gate is made of a silicon nitride film. Contact holes are then formed between the transfer gates and on the transfer gates. In the first etching process, the silicon nitride film of the third layer is anisotropically etched using the second layer silicon oxide film as an etching stopper. The offset insulating film on the transfer gate is then anisotropically etched until the offset insulating film becomes about as thick as the silicon oxide film. In the second etching process, the insulating material film at the bottom of the opening, the second layer beneath the insulating material film, and the offset insulating film are anisotropically etched to expose the first layer and the transfer gates.

According to this manufacturing method, contact holes can be opened simultaneously on the silicon substrate between the transfer gates and on the transfer gates. Hence, the semiconductor device can be manufactured without requiring an additional lithography process.

The method of anisotropically etching the silicon nitride film (the third layer) using the silicon oxide film (the second layer) as the etching stopper and anisotropically etching the offset insulating film on the transfer gate until the offset insulating film becomes about as thick as the silicon oxide film is as follows. The initial thickness of the offset insulating film and the over-etching time are set so that the thickness of the remaining portion of the offset insulating film will become approximately equal to the thickness of the silicon oxide film (the second layer) during the over-etching time in which the silicon nitride film (the third layer) is etched using the silicon oxide film (the second layer) as an etching stopper.

The offset insulating film may be a two-layer film having a silicon nitride film as the upper layer and a silicon oxide film as the lower layer.

In the present invention, any insulating material can be used provided that it can be deposited inside the opening and its insulation characteristic is suitable for the semiconductor device. Silicon oxide and silicon nitride are examples of such insulating materials.

The second etching process may be a process in which the afore-mentioned insulating material layer at the bottom of the afore-mentioned opening and the second layer beneath the insulating material layer are anisotorpically batch-etched to expose the afore-mentioned first layer.

When the insulating material differs from the material of the second layer, in the second etching process, the insulating material layer at the bottom of the hole may be etched using the second layer as the etching stopper. In this case, the exposed second layer is anisotropically etched to expose the first layer. In this way, only the second layer is sufficiently over-etched when the second layer is etched. Therefore, the over-etching requires less time. As a result, the length of time the first layer such as a silicon substrate is irradiated with plasma is reduced, making it possible to form contact holes reducing a damage to the first layer.

The manufacturing method of the present invention is suitable for manufacturing a semiconductor device in which contact holes need to be opened between the transfer gates and on the transfer gates such as a semiconductor memory device.

<First Embodiment>

FIGS. 1 through 13 show each process in the first embodiment. In what follows, the first embodiment will be explained with reference to FIGS. 1 through 13.

(a) As shown in FIG. 1, a device separation region 102 is formed on a silicon substrate 101 using the shallow trench method. After this, using the conventional lithography technique and the conventional etching technique, transfer gates 104 are formed on each of which an offset silicon nitride film 103 is formed. Next, a mask pattern is formed using the conventional lithography technique, and n-type impurities are injected into the silicon substrate 101 using the ion implantation process (hereafter, the ion implantation process will be denoted by I/I). The resist patter during the I/I is not shown in the drawing for simplicity.

Figure 2:
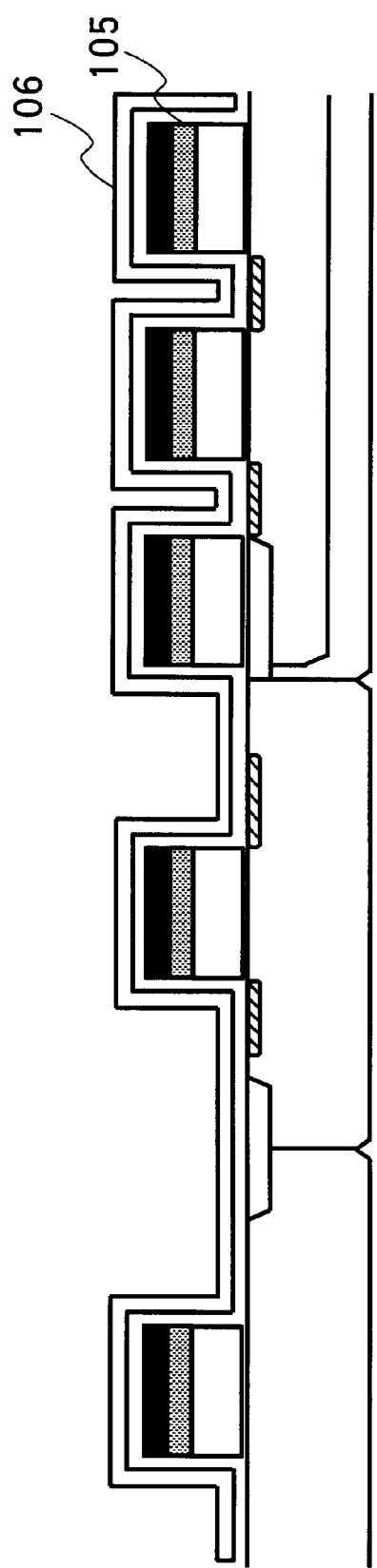
FIG. 2 shows deposition of a silicon oxide film and a polycrystalline film in the second process of the semiconductor device manufacturing method according to the first embodiment of the present invention.

(b) As shown in FIG. 2, an silicon oxide film 105 and a polycrystalline silicon film 106 are deposited in sequence.

Figure 3:
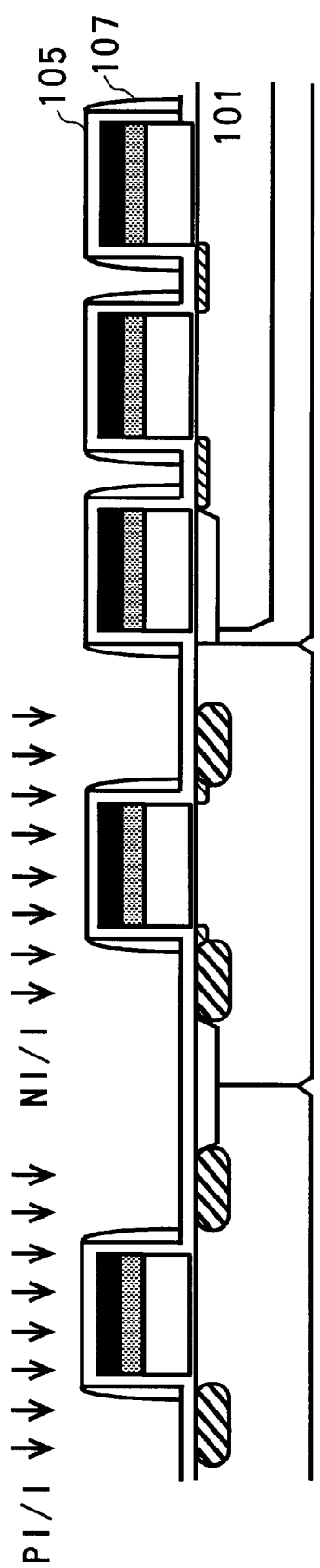
FIG. 3 shows formation of side walls by etching, and injection of impurities, in the third process of the semiconductor device manufacturing method according to the first embodiment of the present invention.

(c) As shown in FIG. 3, a side wall 107 is formed by etching the polycrystalline silicon film 106 using, for example, an ECR plasma etching apparatus having a discharge frequency of 2.45 GHz under the conditions of pressure=5 mTorr, reaction gas flow rate $Cl_2$=100 cc/min, microwave power=300 W, and electrode temperature=20° C. The thickness of the polycrystalline silicon film 106 is set so that the sum of the thickness of the silicon oxide film 105 and the width of the polycrystalline silicon film 106 that remains after the etching will be equal to the designated width of the side wall 107. Next, a mask pattern is formed using the conventional lithography technique, and n-type impurities and p-type impurities are injected into the silicon substrate 101 by I/I, respectively. The resist pattern during the I/I is not shown in the drawing for simplicity.

Figure 4:
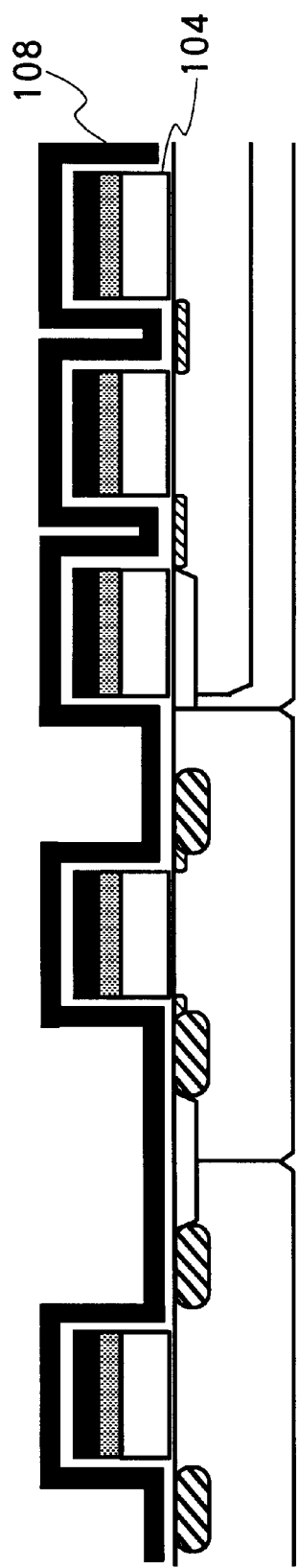
FIG. 4 shows etching of side walls and deposition of a silicon nitride film in the fourth process of the semiconductor device manufacturing method according to the first embodiment of the present invention.

(d) As shown in FIG. 4, the polycrystalline silicon film of the side wall 107 is isotropically etched securing the sufficient selectively of the polycrystalline silicon with respect to a sufficient amount of silicon oxide using, for example, a microwave down flow etching apparatus having a discharge frequency of 2.45 GHz under the conditions of pressure=40 Pa, reaction gas flow rate $CF_4/O_2/Cl_2$=175/125/40 cc/min, microwave power=500 W, and electrode temperature=20° C. Next, a silicon nitride film 108 that will function as a stopper is deposited to the thickness that the silicon nitride film 108 will not completely seal the groove 200 between the transfer gates 104 of the memory cell array unit.

Figure 5:
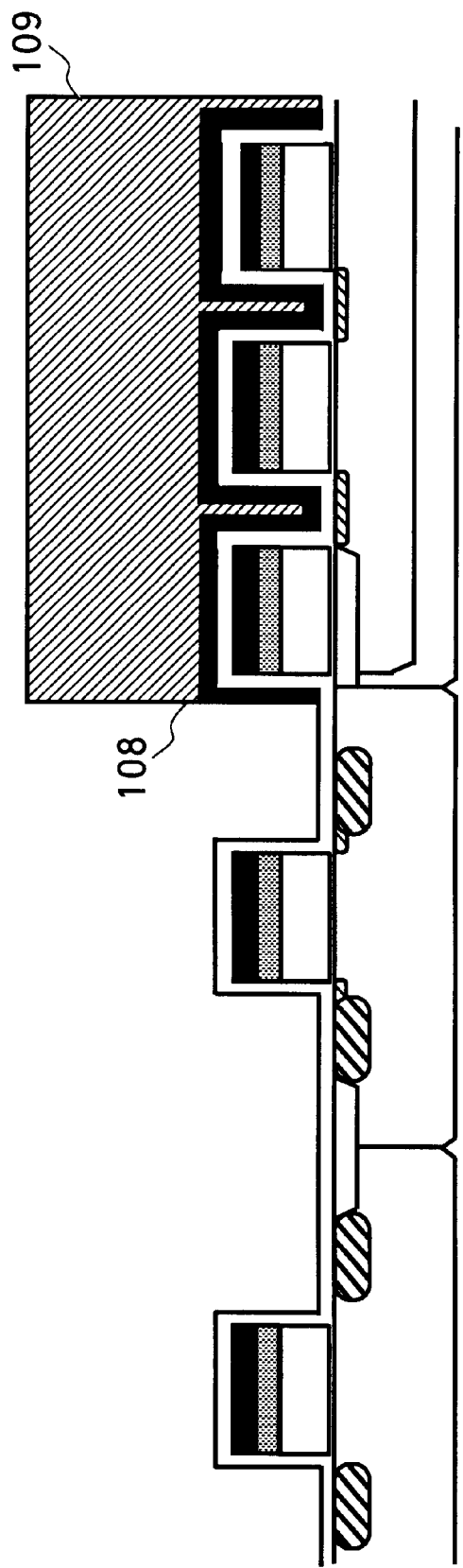
FIG. 5 shows formation of a resist and etching of the silicon nitride film in the fifth process of the semiconductor device manufacturing method according to the first embodiment of the present invention.

(e) As shown in FIG. 5, a resist 109 is formed using the conventional lithography technique so that the pattern of the resist 109 will cover only the memory cell array unit. Next, the silicon nitride film 108 is isotropically etched securing the sufficient selectively of the silicon nitride with respect to the silicon oxide using, for example, a microwave down flow etching apparatus having a discharge frequency of 2.45 GHz under the conditions of pressure=80 Pa, reaction gas flow rate $CF_4/O_2/Cl_2/N_2$=270/270/80/160 cc/min, microwave power=600 W, and electrode temperature=20° C.

Figure 6:
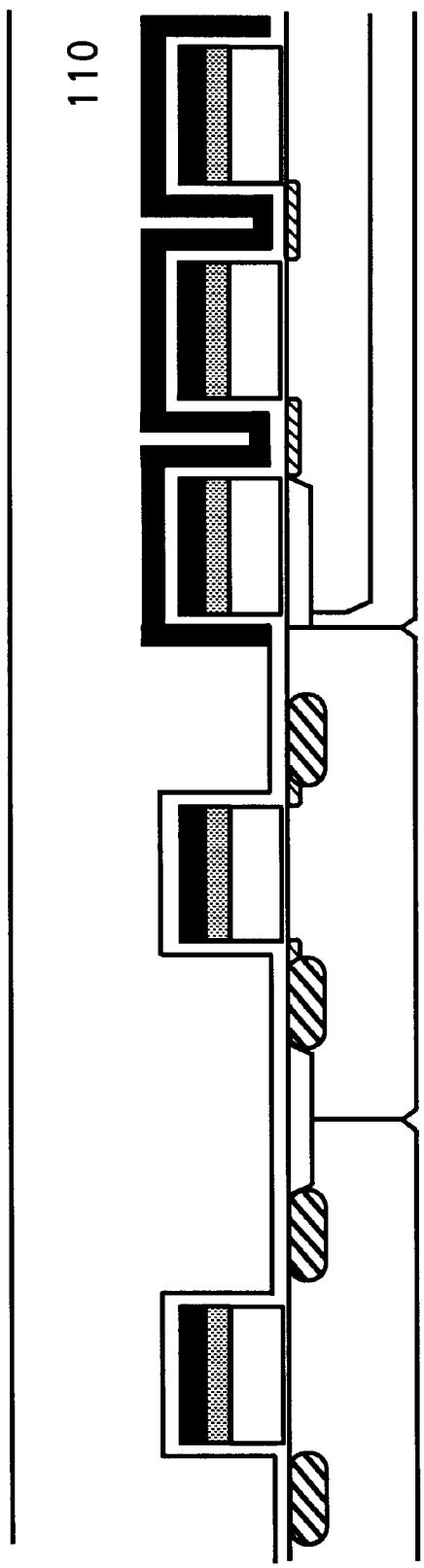
FIG. 6 shows formation of a silicon oxide film in the sixth process of the semiconductor device manufacturing method according to the first embodiment of the present invention.

(f) As shown in FIG. 6, a silicon oxide film 110 is deposited after incinerating the resist 109. After this, the silicon oxide film 110 is smoothed out and flattened using the chemical-mechanical polishing method (the chemical-mechanical polishing method will be referred to as CMP hereafter).

Figure 7:
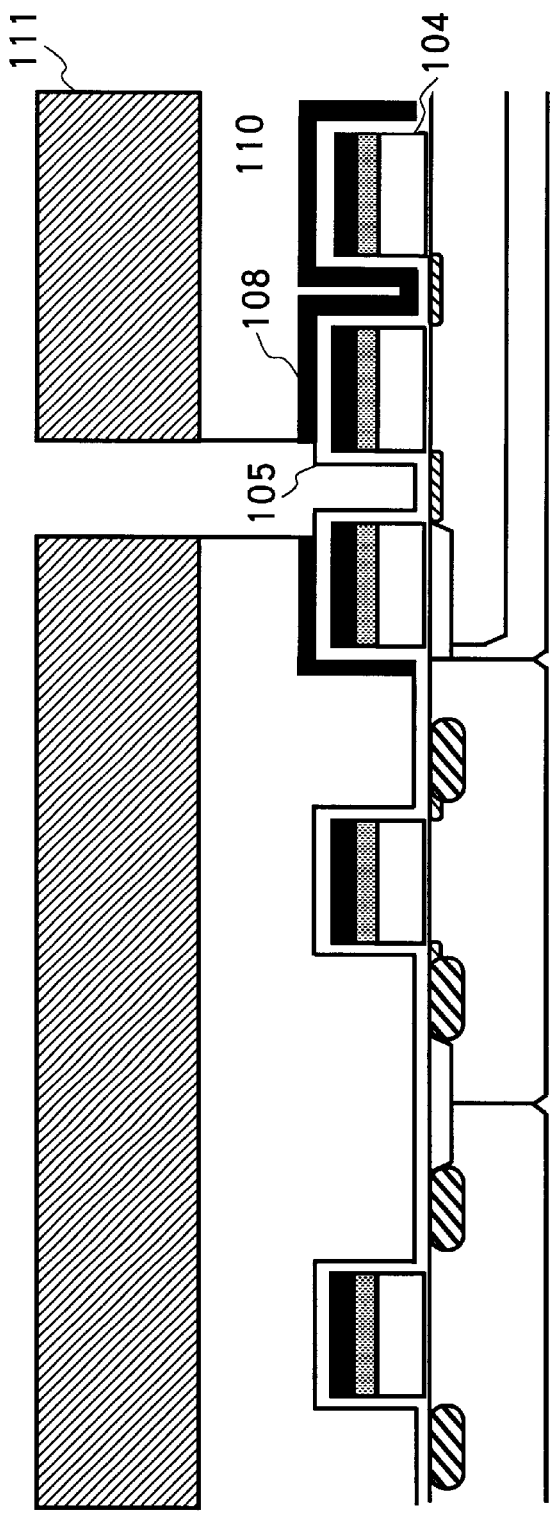
FIG. 7 shows formation of a resist and etching of the silicon nitride film in the seventh process of the semiconductor device manufacturing method according to the first embodiment of the present invention.

(g) As shown in FIG. 7, a resist 111 is prepared and the pattern of an opening to be opened between the transfer gates 104 of the memory cell array unit is formed using the conventional lithography technique. Next, the silicon oxide film 110 is etched using the silicon nitride film 108 as a stopper and using, for example, a magnetron etching apparatus under the conditions of pressure=40 mTorr, reaction gas flow rate $C_4F_8/Ar/CO$=16/400/300 cc/min, RF power=1300 W, and electrode temperature=20° C. After this, the fluorocarbon type polymerized film deposited over the silicon nitride film 108 is removed using, for example, an electron cyclotron resonance type etching apparatus under the conditions of pressure=10 mTorr, reaction gas flow rate $O_2$=100 cc/min, source power=700 W, bias power=100 W, cooling He back pressure=8 Torr, and electrode temperature=30° C. After this, the silicon nitride film 108 is etched using the silicon oxide film 304 as a stopper under the conditions of pressure=10 mTorr, reaction gas flow rate $He/CH_2F_2$=100/15 cc/min, microwave power=250 W, RF power=100 W, cooling He pressure=8 Torr, and electrode temperature=30° C.

Figure 8:
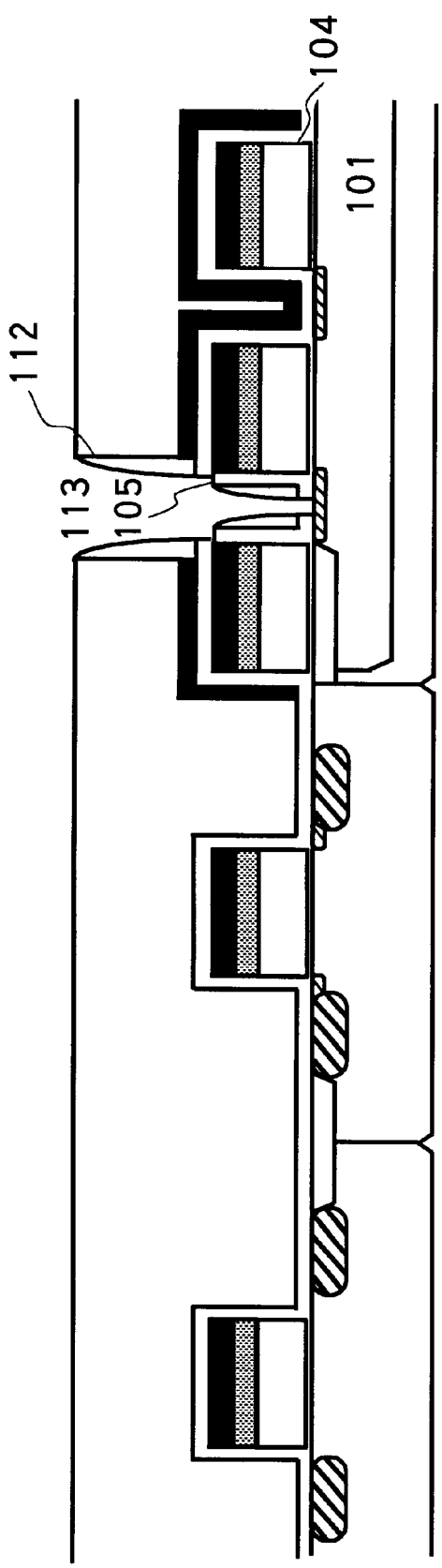
FIG. 8 shows deposition of a silicon oxide film and formation of contact holes by etching in the eighth process of the semiconductor device manufacturing method according to the first embodiment of the present invention.

(h) As shown in FIG. 8, after the resist 111 is incinerated, a silicon oxide film 112 is deposited. In this case, the silicon oxide film 112 is formed to the thickness that satisfies the following three conditions. First, the silicon oxide film 112 does not seal the portion between the transfer gates 104 of the memory cell array unit. Second, the silicon oxide film 112 secures insulation between the transfer gate 104, and the capacitor electrodes. Third, the diameter of the opening in a direction parallel to the transfer gates 104 (a direction in which the contact holes cannot be formed in a self-aligning manner) after the insulating material film is deposited (In FIG. 13, the contact holes are represented by circles. However, the contact holes need not be circular.) is shorter than the length of the activation region, in which the contact holes are formed, in the direction (this length corresponds to d1 in shown in FIG. 13.). The contact holes 113 are formed on the silicon substrate 101 by anisotropically etching the silicon oxide films 112 and 105 using, for example, a parallel plate type etching apparatus under the conditions of pressure=500 mTorr, reaction gas flow rate $Ar/CHF_3/CF_4$=400/20/20 cc/min, RF power=250 W, cooling He back pressure center/edge=5/15 Torr, and electrode temperature=0° C. In what follows, the contact holes will be referred to as pad contact holes.

Figure 9:
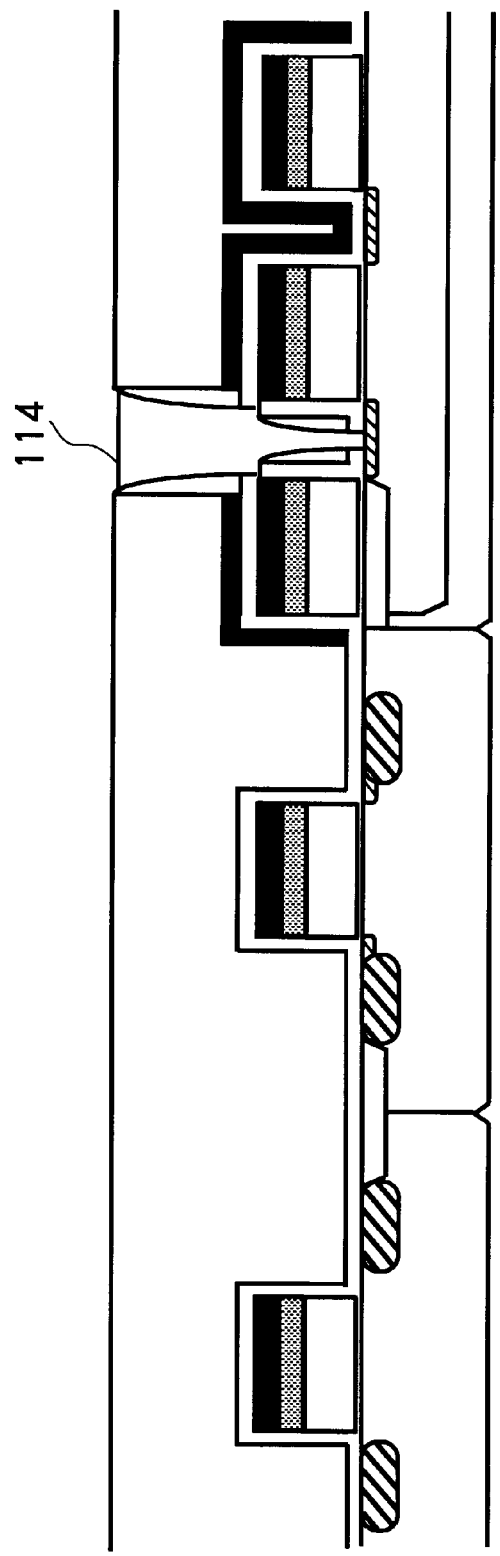
FIG. 9 shows formation of a pad in the ninth process of the semiconductor device manufacturing method according to the first embodiment of the present invention.

(i) As shown in FIG. 9, the pad contact hole 113 is sealed with a polycrystal line silicon film. The pad contact hole 113 is then etched back. As a result, the pad 114 for connecting the capacitor electrode with the silicon substrate 101 is formed.

Figure 10:
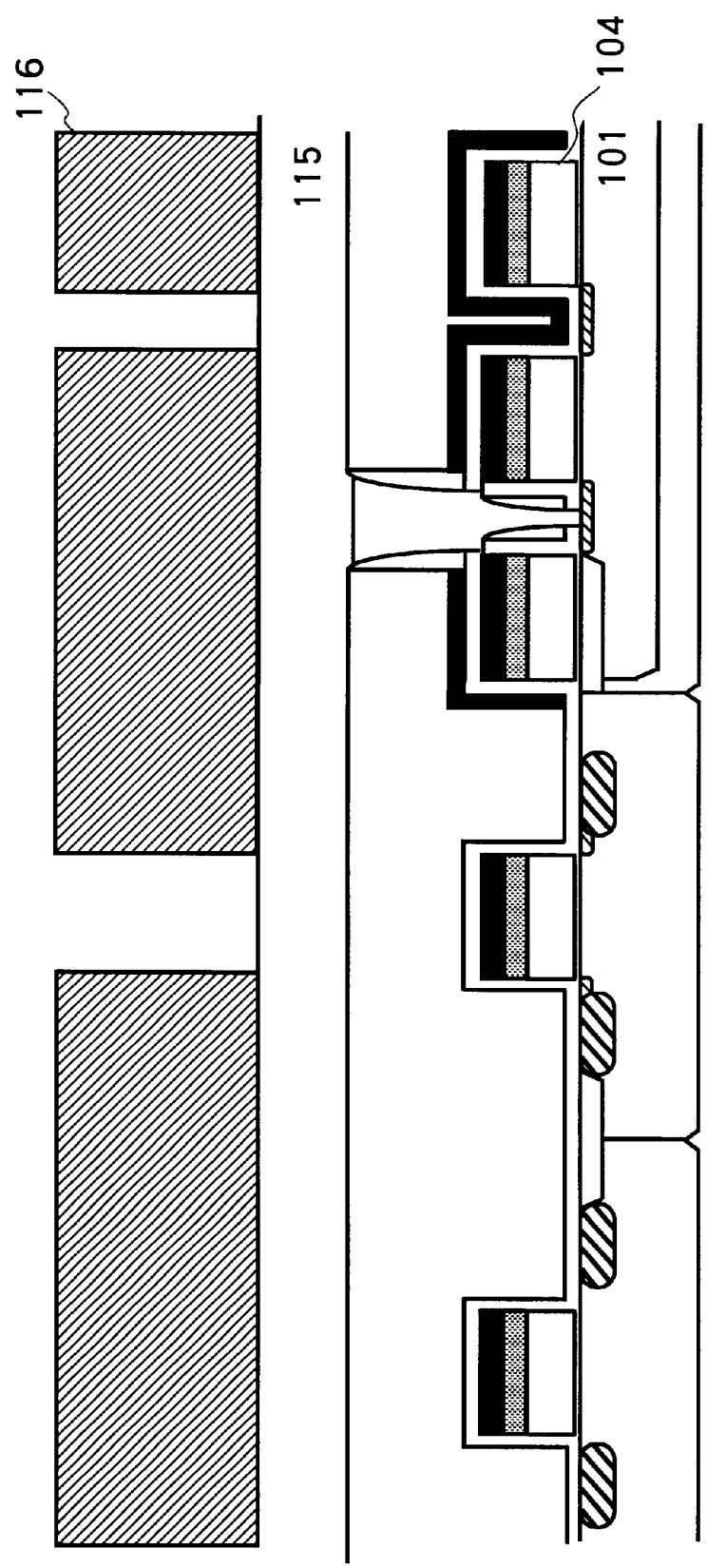
FIG. 10 shows deposition of a silicon oxide film and a resist in the tenth process of the semiconductor device manufacturing method according to the first embodiment of the present invention.

(j) As shown in FIG. 10, after the silicon oxide film 115 is deposited, the resist 116 of the opening pattern to be opened on the silicon substrate 101 and on the transfer gate 104 is formed by the conventional lithography technique.

Figure 11:
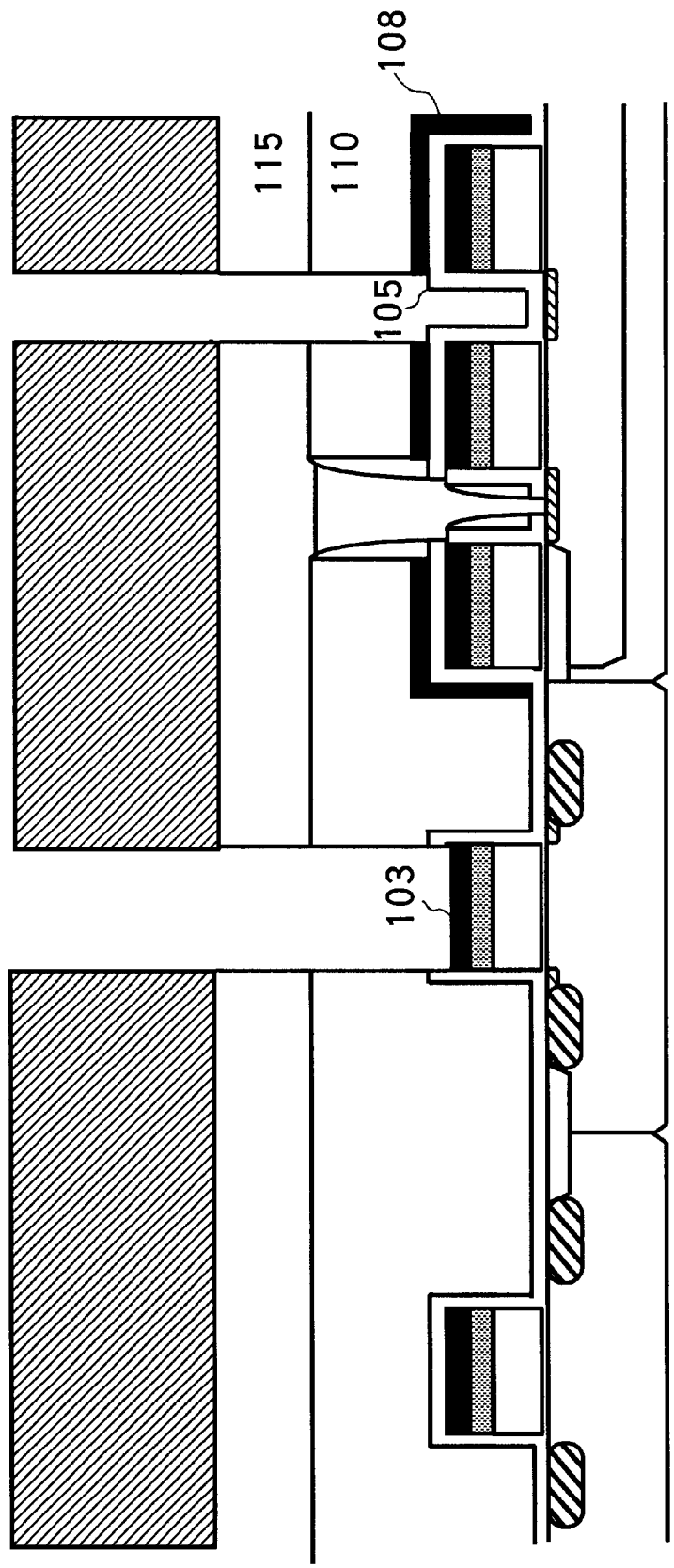
FIG. 11 shows etching of the silicon oxide films and removal of fluorocarbon type polymerized film in the eleventh process of the semiconductor device manufacturing method according to the first embodiment of the present invention.

(k) As shown in FIG. 11, the silicon oxide films 110 and 115 are etched using the silicon nitride film 108 as a stopper and using, for example, a magnetron etching apparatus under the conditions of pressure=40 mTorr, reaction gas flow rate $C_4F_8/Ar/CO=16/400/300$ cc/min, RF power=1300 W, inter electrode distance=27 mm, cooling He back pressure center/edge=3/70 Torr, and electrode temperature=20° C. After this, the fluorocarbon type polymerized film deposited over the silicon nitride film 108 is removed using, for example, an electron cyclotron resonance type etching apparatus under the conditions of pressure=10 mTorr, reaction gas flow rate $O_2$=100 cc/min, source power=700 W, bias power=100 W, RF power=700 W, cooling He pressure=8 Torr, and electrode temperature=30° C. After this, the silicon nitride film 108 of the memory cell array unit is etched using the silicon oxide film 105 as a stopper and using the same apparatus under the conditions of pressure=10 mTorr, reaction gas flow rate $He/CH_2F_2$=100/15 cc/min, microwave power=250 W, RF power=100 W, cooling He pressure=8 Torr, and electrode temperature=30° C. In this case, the initial thickness of the offset silicon nitride film 103 and the over-etching time for the silicon nitride film 108 are set so that the thickness of the remaining portion of the offset silicon nitride film 103 will become approximately equal to the thickness of the silicon oxide film 105 at the end of the over-etching time.

Figure 12:
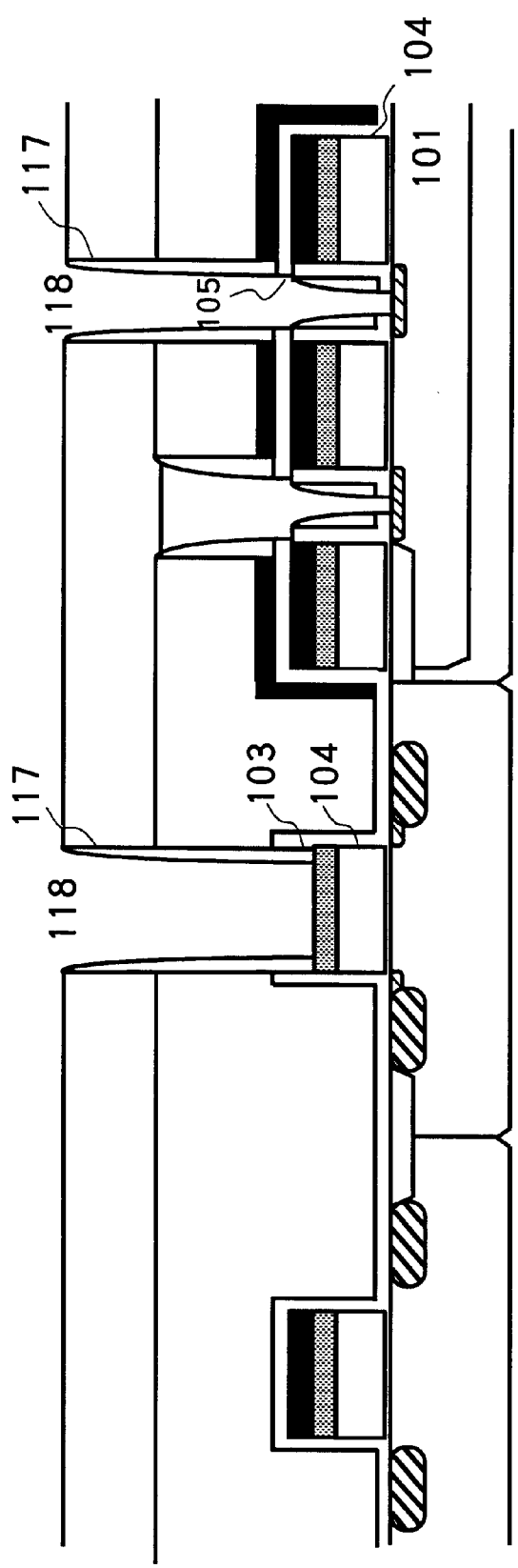
FIG. 12 shows formation of silicon oxide films in the twelfth process of the semiconductor device manufacturing method according to the first embodiment of the present invention.
Figure 13:
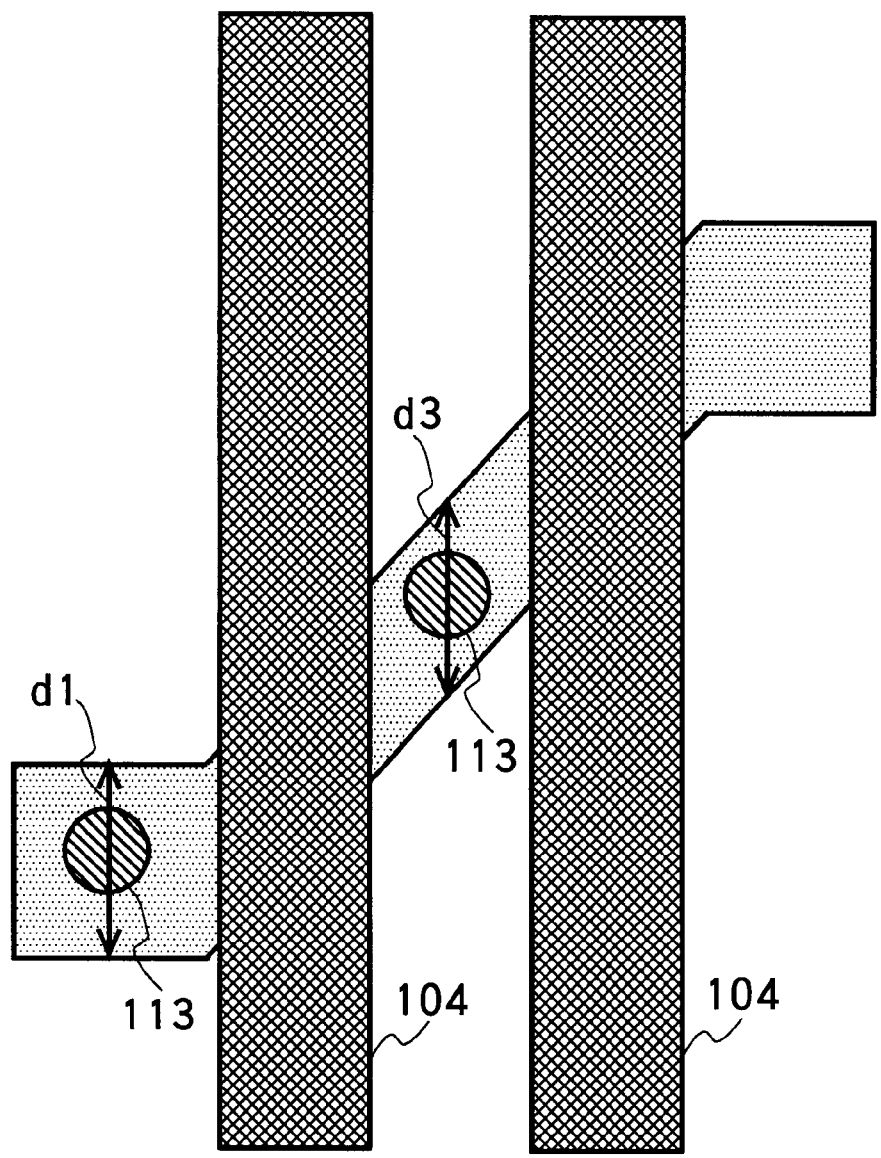
FIG. 13 shows a top view of transfer gates and contact holes in the thirteenth process of the semiconductor device manufacturing method according to the first embodiment of the present invention.

(l) As shown in FIG. 12, after the resist 116 is incinerated, a silicon oxide film 117 is deposited. In this case, the silicon oxide film 117 is formed to the thickness that satisfies the following three conditions. First, the silicon oxide film 117 does not completely seal the groove between the transfer gates 104 of the memory cell array unit. Second, the silicon oxide film 117 secures insulation between the transfer gates 104 and the bit line. Third, the diameter of the opening in a direction parallel to the transfer gates 104 (a direction in which the contact holes cannot be formed in a self-aligning manner) after the silicon oxide film 117 is deposited (In FIG. 13, the contact holes are represented by circles. However, the contact holes need not be circular.) is shorter than the length of the activation region, in which the contact holes are formed, in the direction (this length corresponds to d3 in shown in FIG. 13.). The contact holes 118 are then opened on the silicon substrate 101 and on the transfer gates 104 by anisotropically etching the silicon oxide films 117 and 105 and the silicon nitride film 103 using, for example, a parallel plate type etching apparatus under the conditions of pressure=500 mTorr, reaction gas flow rate $Ar/CHF_3/CF_4$= 400/20/20 cc/min, RF power=250 W, cooling He pressure center/edge=5/15 Torr, and electrode temperature=0° C. In what follows, the contact holes will be referred to as bit line contact holes.

Hereafter, a semiconductor device is manufactured by sequentially conducting the process after forming capacitor electrodes in accordance with the conventional semiconductor device manufacturing process.

According to the present embodiment, first in the laminating process, a silicon oxide film (the second layer) is deposited on a silicon substrate (the first layer) and transfer gates are formed on the silicon substrate. Next, a silicon nitride film (the third layer) is formed on the silicon oxide film (the second layer) to the thickness that satisfies the following two conditions. First, the silicon nitride film (the third layer) does not completely seal the groove between the transfer gates. Second, the silicon nitride film (the third layer) functions as an etching stopper. After this, in the first etching process, a silicon oxide film (fourth layer) is deposited on the silicon nitride film (the third layer). An opening is then formed on the silicon oxide film (fourth layer) using the silicon nitride film (third layer) as an etching stopper. The silicon nitride film (third layer) is then etched using the silicon oxide film (second layer) as an etching stopper. Next, in the depositing process, an insulating material film (silicon oxide film) satisfies the following three conditions. First, the insulating material film does not completely seal the groove between the transfer gates. Second, the insulating material film secures insulation between the conductive material (bit lines and capacitor electrodes will be formed from this conductive material) to be embedded inside the contact holes and the transfer gates. Third, the insulating material film is deposited to the thickness that the diameter of the opening in a direction parallel to the transfer gates (a direction in which the contact holes cannot be formed in a self-aligning manner) after the insulating material film is deposited becomes shorter than the length of the activation region, in which the insulating material film is deposited, in the same direction. Next, in the second etching process, the insulating material film at the bottom of the opening and the silicon oxide film (the second layer) are anisotropically etched. In this way, the contact holes are formed. Therefore, the present embodiment is capable of coping with scale reduction of the semiconductor device and forming contact holes keeping the device separation characteristics from deteriorating.

In addition, the silicon nitride film on the transfer gates is used as an offset insulating film. In this case, the initial thickness of the offset insulating film (the third layer) and the over-etching time are set so that the thickness of the remaining portion of the offset insulating film will become approximately equal to the thickness of the silicon oxide film (the second layer) at the end of the over-etching time in which the silicon nitride film (the third layer) is etched using the silicon oxide film (the second layer) as an etching stopper. Therefore, the distance from the bottom of the opening, which becomes a bit line contact hole after the first etching process, to the silicon substrate becomes almost equal to, the distance from the bottom of the opening to the transfer gate. As a result, contact holes can be formed on the silicon substrate and the transfer gate at the same time. Therefore, the present embodiment provides a semiconductor device manufacturing method which does not require any additional lithography process.

Moreover, in the present embodiment, in the pad contact hole formation process (h) and the bit line contact hole formation process (l), contact holes can be formed on the silicon substrate 101 or transfer gates 104, by depositing a silicon nitride film in place of the silicon oxide film 112 or 117, and then by anisotropically etching the silicon nitride film and the silicon oxide film. In this case also, the same effect as in the above-described embodiment can be obtained.

Moreover, in the present embodiment, in the process (a), a laminated structure having a silicon nitride film as the top layer and a silicon oxide film as the bottom layer may be formed in place of the offset silicon nitride film 103 that is formed on the transfer gates 104. Moreover, the device separation region 102 may be formed by the LOCOS method instead of the shallow trench method.

Moreover, in the present embodiment, in the processes (b) and (c), a silicon nitride film may be used in place of the polycrystalline silicon film 106 to form the side wall by etching the silicon nitride film using the silicon oxide film 105 as an etching stopper.

<Second Embodiment>

The second embodiment differs from the first embodiment in the following respects. In the pad contact hole formation process (h), a silicon nitride film is deposited in place of the silicon oxide film 112. The silicon nitride film is then anisotropically etched using the silicon oxide film as an etching stopper. The silicon oxide film is then anisotropically etched to form contact holes on the silicon substrate. In the bit line contact hole formation process (l), a silicon nitride film is deposited in place of the silicon oxide film 117. The silicon nitride film is then anisotropically etched using the silicon oxide film as an etching stopper. The silicon oxide film is then anisotropically etched to form contact holes on the transfer gates.

In what follows, the processes in the second embodiment will be explained with reference to FIGS. 14 and 15.

Processes (a) through (g) are carried out in the same manner as in the first embodiment.

Figure 14:
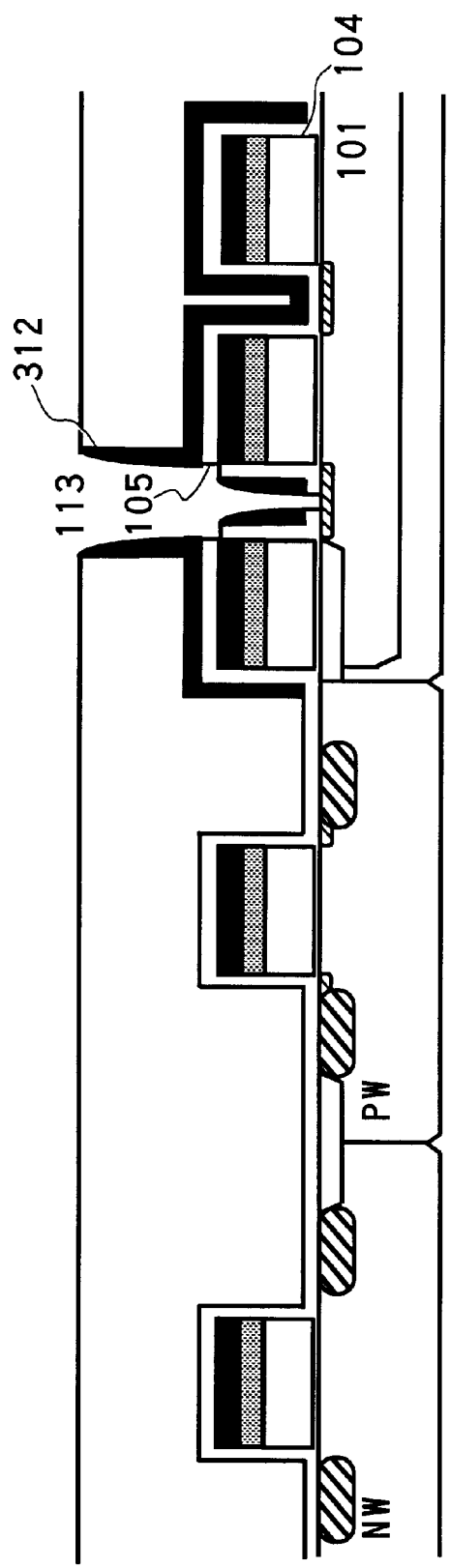
FIG. 14 shows deposition of a silicon nitride film and formation of contact holes by etching in the eighth process of the semiconductor device manufacturing method according to the second embodiment of the present invention.

(h) As shown in FIG. 14, the resist is first incinerated. Next, a silicon nitride film 312 is deposited. In this case, the silicon nitride film 312 is formed to the thickness that satisfies the following three conditions. First, the silicon nitride film 312 does not completely seal the portion between the transfer gates 104 of the memory cell array unit. Second, the silicon nitride film 312 secures insulation between the transfer gate 104 and the capacitor electrodes. Third, the diameter of the opening in a direction parallel to the transfer gates 104 (a direction in which the contact holes cannot be formed in a self-aligning manner) after the insulating material film is deposited is shorter than the length of the activation region, in which the contact holes are formed, in the direction. The silicon nitride film 312 is then selectively etched with respect to the silicon oxide film 105 using, for example, an electron cyclotron resonance type etching apparatus under the conditions of pressure=10 mTorr, microwave power=250 W, reaction gas flow rate He/CH$_2$F$_2$=100/15 cc/min, RF power=100 W, cooling He pressure=8 Torr, and electrode temperature=30° C. After this, the contact holes 113 are formed on the silicon substrate 101 by anisotropically etching the silicon oxide film 105 using, for example, an electron cyclotron resonance type etching apparatus under the conditions of pressure=10 mTorr, microwave power=250 W, reaction gas flow rate He/CHF$_3$=100/15 cc/min, RF power=120 W, cooling He pressure=8 Torr, and electrode temperature=30° C. In what follows, the contact holes will be referred to as pad contact holes.

Processes (i) through (k) are carried out in the same manner as in the first embodiment.

Figure 15:
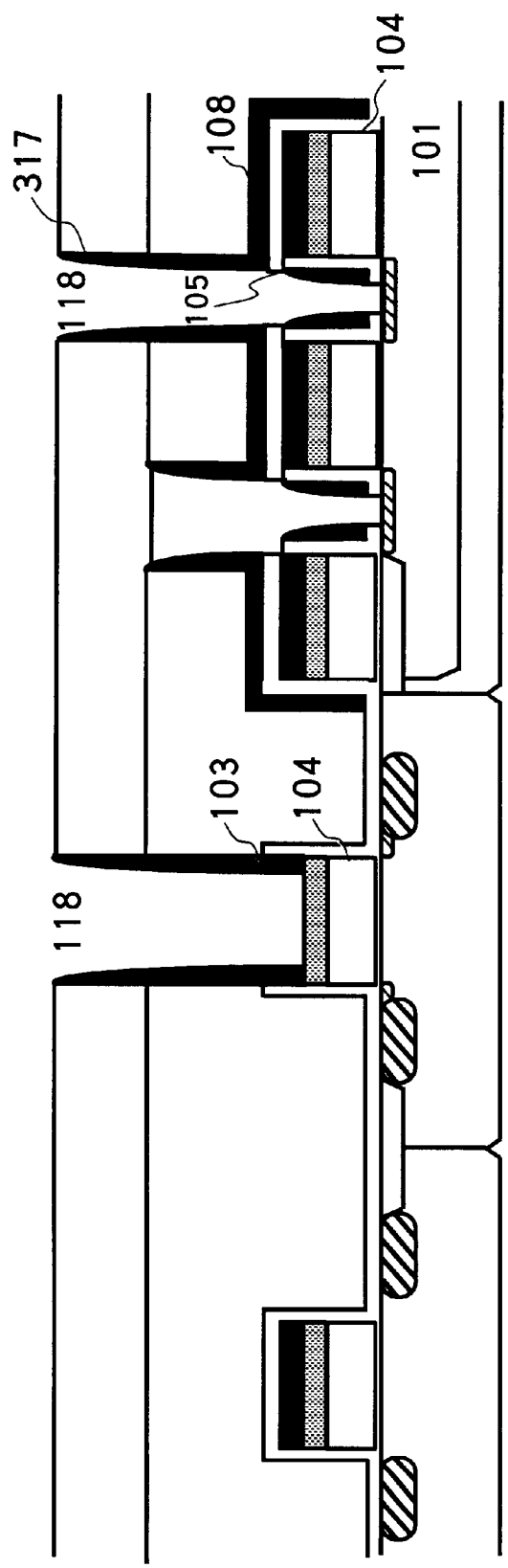
FIG. 15 shows formation of silicon nitride films in the twelfth process of the semiconductor device manufacturing method according to the second embodiment of the present invention.

(l) As shown in FIG. 15, after the resist is incinerated, a silicon nitride film 317 is deposited. In this case, the silicon nitride film 317 is formed to the thickness that satisfies the following three conditions. First, the silicon nitride film 317 does not completely seal the groove between the transfer gates 104 of the memory cell array unit. Second, the silicon nitride film 317 secures insulation between the transfer gate 104 and the bit line. Third, the diameter of the opening in a direction parallel to the transfer gates 104 (a direction in which the contact holes cannot be formed in a self-aligning manner) after the insulating material film is deposited is shorter than the length of the activation region, in which the contact holes are formed, in the direction. The silicon nitride film 317 is then etched using the silicon oxide film 105 as an etching stopper and using, for example, an electron cyclotron resonance type etching apparatus under the conditions of pressure=10 mTorr, microwave power=250 W, reaction gas flow rate He/CH$_2$F$_2$=100/15 cc/min, RF power=100 W, cooling He pressure=8 Torr, and electrode temperature=30° C. In the portion in which contact holes are formed on the transfer gates 104, the offset silicon nitride film 103 is etched simultaneously when the silicon nitride films 108 and 317 are etched. In this case, the initial thickness of the offset silicon nitride film 103 and the over-etching time in each of the processes are set so that the thickness of the remaining portion of the offset silicon nitride film 103 after the silicon nitride film 317 has been etched will be approximately equal to the thickness of the remaining portion of the silicon oxide film 105. Next, contact holes 118 are formed on the silicon substrate 101 by anisotropically etching the silicon oxide film 105 using, for example, an electron cyclotron resonance type etching apparatus under the conditions of pressure=10 mTorr, microwave power=250 W, reaction gas flow rate He/CHF$_3$=100/15 cc/min, RF power=120 W, cooling He pressure=8 Torr, and electrode temperature=30° C. In the same manner, contact holes 118 are formed on the transfer gates 104 by anisotropically etching the offset silicon nitride film 103. In what follows, the contact holes will be referred to as bit line contact holes.

Hereafter, a semiconductor device is manufactured by sequentially conducting the process after forming capacitor electrodes in accordance with the conventional semiconductor device manufacturing process.

In the present embodiment also, the same effect can be achieved as in the first embodiment.

When a silicon nitride film is used, by carrying out in steps the last-stage anisotropy etching for forming the contact holes as in the present embodiment, the contact holes can be formed in a more stable manner than in the case in which the silicon nitride film and the silicon oxide film are formed at the same time.

Moreover, in the present embodiment, only the thin silicon oxide film is etched even under the condition that the silicon oxide film beneath the silicon nitride film that functions as the etching stopper is over-etched sufficiently. Therefore, the over-etching requires less time, which means that the length of time the silicon substrate is irradiated with plasma is reduced. As a result, the damage inflicted on the silicon substrate is reduced when the contact holes are formed.

Thus, according to the present invention, etching techniques are provided capable of coping with scale reduction of the semiconductor device and forming contact holes keeping the device separation characteristics from deteriorating.

What is claimed is:

1. A method for forming a contact hole in the manufacture of a semiconductor device, comprising:

a laminating process for laminating in sequence at least a first layer, a second layer, and a third layer, in which said second layer and said third layer are laminated sequentially over said first layer so as to cover a plurality of gate electrodes formed on said first layer;

a first etching process in which an opening unit is formed between said gate electrodes and said third layer is etched using said second layer as an etching stopper;

a depositing process in which an insulating material film is deposited on a side wall of said opening unit and a bottom portion of said opening unit to a thickness with which said insulating material film functions as a spacer for insulation; and a second etching process in which a contact hole is formed by anisotropically etching said insulating material film deposited at said bottom portion of said opening unit and said second layer beneath said insulating material film to expose said first layer;

wherein said plurality of gate electrodes extend substantially parallel to each other in a first direction crossing an activation region, and said contact hole is formed between said gate electrodes, and wherein, in said depositing process, said insulating material film is deposited to a thickness with which a portion between a conductive material to be embedded inside said contact hole and said electrodes will be securely insulated, and a diameter of said opening unit in said first direction parallel to said electrodes after said insulating material film has been deposited is shorter than a length in said first direction of said activation region in which said contact hole is formed.

2. A method as claimed in claim 1, wherein said second layer is a silicon oxide film and said third layer is a silicon nitride film.

3. A method for forming a contact hole in the manufacture of a semiconductor device, comprising:

a laminating process for laminating in sequence at least a first layer, a second layer, and a third layer, in which said second layer and said third layer are laminated sequentially over said first layer so as to cover a plurality of gate electrodes formed on said first layer;

a first etching process in which an opening unit is formed between said gate electrodes and said third layer is etched using said second layer as an etching stopper;

a depositing process in which an insulating material film is deposited on a side wall of said opening unit and a bottom portion of said opening unit to a thickness with which said insulating material film functions as a spacer for insulation; and a second etching process in which a contact hole is formed by anisotropically etching said insulating material film deposited at said bottom portion of said opening unit and said second layer beneath said insulating material film to expose said first layer;

wherein said second layer is a silicon oxide film and said third layer is a silicon nitride film;

wherein an offset insulating film formed on each of transfer gates is a silicon nitride film and said contact hole is formed between said transfer gates, wherein, in said first etching process, said silicon nitride film as said third layer is anisotropically etched using said silicon oxide film as said second layer as an etching stopper, and said offset insulating film on said transfer gate is anisotropically etched until a thickness of said offset insulating film becomes substantially equal to a thickness of said silicon oxide film of said second layer, and wherein, in said second etching process, said insulating material film deposited at said bottom portion of said opening unit, said second layer beneath said insulating material film, and said offset insulating film are anisotropically etched to expose said first layer and said transfer gate.

4. A method as claimed in claim 3, wherein said offset insulating film is a two layer film having a silicon nitride film as an upper layer and a silicon oxide film as a lower layer.

5. A method as claimed in claim 1, wherein said insulating material film is a silicon oxide film or a silicon nitride film.

6. A method as claimed in claim 1, wherein said in second layer is made of a first material and said insulating material film is made of a second material that is different from said first material, and wherein, in said second etching process, said insulating material film at said bottom portion of said opening unit is etched using said second layer as an etching stopper until said second layer is exposed, and then said exposed second layer is anisotropically etched to expose said first layer.

7. A method for forming a contact hole in the manufacture of a semiconductor device, comprising:

a laminating process for laminating in sequence at least a first layer, a second layer, and a third layer, in which said second layer and said third layer are laminated sequentially over said first layer so as to cover a plurality of gate electrodes formed on said first layer;

a first etching process in which an opening unit is formed between said gate electrodes and said third layer is etched using said second layer as an etching stopper;

a depositing process in which an insulating material film is deposited on a side wall of said opening unit and a bottom portion of said opening unit to a thickness with which said insulating material film functions as a spacer for insulation; and a second etching process in which a contact hole is formed by anisotropically etching said insulating material film deposited at said bottom portion of said opening unit and said second layer beneath said insulating material film to expose said first layer;

wherein, in said second etching process, said insulating material film at said bottom portion of said opening unit and said second layer beneath said insulating material film are anisotropically etched to expose said first layer.

8. A method as claimed in claim 1, wherein said semiconductor device is a semiconductor memory device.

9. A method for forming a contact hole in the manufacture of a semiconductor device, comprising:

a laminating process for laminating in sequence at least a first layer, a second layer, a third layer and a fourth layer, in which said second layer, said third layer, and said fourth layer are laminated sequentially over said first layer so as to cover a plurality of gate electrodes formed on said first layer;

a first etching process in which an opening unit is formed between said gate electrodes, said fourth layer is etched using said third layer as an etching stopper to expose said third layer, and said exposed third layer is anisotropically etched using said second layer as an etching stopper;

a depositing process in which an insulating material film is deposited on a side wall of said opening unit and a bottom portion of said opening unit to a thickness with which said insulating material film functions as a spacer for insulation; and a second etching process in which a contact hole is formed by anisotropically etching said insulating material film deposited at said bottom portion of said opening unit and said second layer beneath said insulating material film to expose said first layer;

wherein said plurality of gate electrodes extend substantially parallel to each other in a first direction crossing an activation region, and said contact hole is formed between said gate electrodes, and wherein, in said depositing process, said insulation material film is deposited to a thickness with which a portion between a conductive material to be embedded inside said contact hole and said electrodes will be securely insulated, and a diameter of said opening unit in said first direction after said insulating material film has been deposited is shorter than a length in said first direction of said activation region in which said contact hole is formed.

10. A method as claimed in claim 9, wherein said second layer is a silicon oxide film, said third layer is a silicon nitride film, and said fourth layer is a silicon oxide film.

11. A method for forming a contact hole in the manufacture of a semiconductor device, comprising:

a laminating process for laminating in sequence at least a first layer, a second layer, a third layer and a fourth layer, in which said second layer, said third layer, and said fourth layer are laminated sequentially over said first layer so as to cover a plurality of gate electrodes formed on said first layer;

a first etching process in which an opening unit is formed between said gate electrodes, said fourth layer is etched using said third layer as an etching stopper to expose said third layer, and said exposed third layer is anisotropically etched using said second layer as an etching stopper;

a depositing process in which an insulating material film is deposited on a side wall of said opening unit and a bottom portion of said opening unit to a thickness with which said insulating material film functions as a spacer for insulation; and a second etching process in which a contact hole is formed by anisotropically etching said insulating material film deposited at said bottom portion of said opening unit and said second layer beneath said insulating material film to expose said first layer;

wherein said second layer is a silicon oxide film, said third layer is a silicon nitride film, and said fourth layer is a silicon oxide film, wherein an offset insulating film formed on each of transfer gates is a silicon nitride film and said contact hole is formed between said transfer gates, wherein, in said first etching process, said silicon nitride film of said third layer is anisotropically etched using said silicon oxide film of said second layer as an etching stopper, and said offset insulating film on said transfer gate is anisotropically etched until a thickness of said offset insulating film becomes substantially equal to a thickness of said silicon oxide film of said second layer, and wherein, in said second etching process, said insulating material film deposited at said bottom portion of said opening unit, said second layer beneath said insulating material film, and said offset insulating film are anisotropically etched to expose said first layer and said transfer gate.

12. A method as claimed in claim 11, wherein said offset insulating film is a two layer film having a silicon nitride film as an upper layer and a silicon oxide film as a lower layer.

13. A method as claimed in claim 9, wherein said insulating material film is a silicon oxide film or a silicon nitride film.

14. A method for forming a contact hole in the manufacture of a semiconductor device, comprising:

a laminating process for laminating in sequence at least a first layer, a second layer, a third layer and a fourth layer, in which said second layer, said third layer, and said fourth layer are laminated sequentially over said first layer so as to cover a plurality of gate electrodes formed on said first layer;

a first etching process in which an opening unit is formed between said gate electrodes, said fourth layer is etched using said third layer as an etching stopper to expose said third layer, and said exposed third layer is anisotropically etched using said second layer as an etching stopper;

a depositing process in which an insulating material film is deposited on a side wall of said opening unit and a bottom portion of said opening unit to a thickness with which said insulating material film functions as a spacer for insulation; and a second etching process in which a contact hole is formed by anisotropically etching said insulating material film deposited at said bottom portion of said opening unit and said second layer beneath said insulating material film to expose said first layer;

wherein, in said second etching process, said insulating material film at said bottom portion of said opening unit and said second layer beneath said insulating material film are anisotropically etched to expose said first layer.

15. A method as claimed in claim 9, wherein said second layer is made of a first material and said insulating material film is made of a second material that is different from said first material, and wherein, in said etching process, said insulating material film at said bottom portion of said opening unit is etched using said second layer as an etching stopper until said second layer is exposed, and then said exposed second layer is anisotropically etched to expose said first layer.

16. A method as claimed in claim 9, wherein said semiconductor device is a semiconductor memory device.

* * * * *